(12) United States Patent
Park

(10) Patent No.: US 6,975,527 B1
(45) Date of Patent: Dec. 13, 2005

(54) MEMORY DEVICE LAYOUT

(75) Inventor: Kee Park, Santa Clara, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 91 days.

(21) Appl. No.: 10/293,176

(22) Filed: Nov. 12, 2002

(51) Int. Cl.$^7$ .............................. G11C 5/06; G11C 8/00
(52) U.S. Cl. ...................... 365/63; 365/64; 365/230.03
(58) Field of Search ............................ 365/63, 230.03, 365/61

(56) References Cited

U.S. PATENT DOCUMENTS

| | | | | |
|---|---|---|---|---|
| 4,393,392 A | * | 7/1983 | Hale | ........................... 257/664 |
| 5,097,313 A | * | 3/1992 | Fujii | ...................... 365/189.01 |
| 5,276,893 A | * | 1/1994 | Savaria | ........................ 714/10 |
| 5,453,583 A | * | 9/1995 | Rostoker et al. | ............. 174/267 |
| 5,567,655 A | * | 10/1996 | Rostoker et al. | ............. 438/123 |
| 5,604,710 A | | 2/1997 | Tomishima et al. | .... 365/230.03 |
| 5,625,603 A | * | 4/1997 | McClure et al. | ........ 365/230.03 |
| 5,744,870 A | | 4/1998 | Casper | ........................ 257/786 |
| 5,825,083 A | * | 10/1998 | Takata et al. | ................ 257/691 |
| 5,838,627 A | * | 11/1998 | Tomishima et al. | .... 365/230.03 |
| 6,057,169 A | | 5/2000 | Singh et al. | ................... 438/14 |
| 6,084,300 A | * | 7/2000 | Oka | ............................ 257/730 |
| 6,091,089 A | * | 7/2000 | Hiraga | ....................... 257/203 |
| 6,204,689 B1 | * | 3/2001 | Percey et al. | .................. 326/41 |
| 6,211,695 B1 | * | 4/2001 | Agrawal et al. | ............... 326/40 |
| 6,469,327 B1 | * | 10/2002 | Yasuda et al. | ............... 257/207 |
| 6,628,001 B1 | * | 9/2003 | Chittipeddi et al. | ......... 257/797 |
| 2001/0000631 A1 | * | 5/2001 | Zandman et al. | ........... 257/738 |
| 2001/0039644 A1 | * | 11/2001 | Le Coz | ......................... 716/11 |
| 2002/0004932 A1 | * | 1/2002 | Shau | ............................ 716/19 |
| 2002/0110942 A1 | * | 8/2002 | Moghe et al. | ................. 438/26 |
| 2003/0031058 A1 | * | 2/2003 | Kajigaya et al. | ........ 365/189.09 |
| 2003/0081443 A1 | * | 5/2003 | Suwa et al. | ..................... 365/63 |
| 2003/0090879 A1 | * | 5/2003 | Doblar et al. | ................ 361/728 |
| 2003/0107123 A1 | * | 6/2003 | Roohparvar | ................. 257/691 |
| 2003/0201528 A1 | * | 10/2003 | Hsu | ........................... 257/691 |

* cited by examiner

Primary Examiner—Hoai Ho
Assistant Examiner—Ly Duy Pham

(57) ABSTRACT

A number of memory array units are placed on a die. Each memory array within a unit is coupled to a channel that includes one or more data lines coupled to a pad on the die. Each memory array unit utilizes a different channel. Memory array units are grouped together in pairs on the die to form memory array groups. The two channels of each memory array group form boundaries on the die. The pads coupled to each channel of a memory array group are positioned within those boundaries. The pads may be arranged such that the same pad layout can be used across different dies fabricated for use at different bus widths. In one embodiment, a set of the pads are used in applications where the die is configured for a first bus width and a portion of the pads used in the first bus width applications are not used in applications where the die is configured to for a second bus width. By providing additional pads, the die may be connected to external leads in different bus width configurations and with different external lead sequences without substantially increasing the length of the internal data bus.

9 Claims, 7 Drawing Sheets

X36 BONDING DIAGRAM

X18 BONDING DIAGRAM

US 6,975,527 B1

MEMORY DEVICE LAYOUT

BACKGROUND

1. Technical Field

This invention relates to semiconductor memory devices, and more particularly, to the input/output pad configuration, or "layout," on a semiconductor memory die.

2. Related Art

In one known type of a semiconductor memory package, a semiconductor memory die, or "chip," is mounted on the die paddle of a metal lead frame, and includes a number of input/output wire bonding pads, each coupled to a metallization layer via a bond wire. The die and a portion of the metallization layer are encapsulated in plastic, ceramic or other material. The metallization layer is then cut apart or otherwise processed to free the individual leads, which extend from the package and are used to connect the package to other circuitry.

Many semiconductor devices, such as static random access memories (SRAMs), dynamic random access memories (DRAMs), and first-in first-out devices (FIFOs), include memory arrays. These memory arrays are formed by memory cells arranged in arrays of rows and columns. Thus, the layout of the pads on the die determines the length of conductive traces between those pads and the memory arrays.

The length of the data bus coupled to a memory array is related to the delay over that bus. For example, resistance-capacitance (RC) delay increases as the length of the bus increases. Correspondingly, RC delay on a semiconductor die between a memory array and a pad increases as the length of a conductive trace between the memory array and the pad increases. Thus, there is a need to minimize the length of the conductive traces between the memory arrays and the corresponding pads on the die.

Some memory devices may be adapted to operate in more than one configuration or mode. For example, in one mode, a memory device may be adapted to accommodate data words of a first width and in a second mode, the memory device may be adapted to accommodate data words of a second width, where the second width is greater than the first width. Typically, however, when the chip operates in one mode, the chip requires a first pin sequence and when the chip operates in second mode, the chip requires a second pin sequence different from the first pin sequence. Conventionally, providing a chip with pads for connecting to more than one pin sequence has required the elongation of an internal data bus to provide connection to pads adjacent associated pins to accommodate the second pin sequence. As discussed above, RC delay on a semiconductor die between a memory array and a pad increases as the length of a conductive trace, or bus, between the memory array and the pad increases.

SUMMARY

A need exists for a memory device layout that may be used for different first and second data widths, while minimizing internal data bus length. Another need exists for a memory device layout that may be used with different pin sequences to accommodate chips having different data widths, while minimizing internal data bus length.

In one embodiment, additional input/output (I/O) pads are disposed adjacent pads used for a first chip data width. The additional bonding pads are not connected to leads, or pins, for configurations using the first chip data width, but are used for bonding out to leads in the proper external pin sequence of the external leads for configurations using the second chip data width without substantially increasing the length of the internal data bus.

Pursuant to one embodiment of the present invention, groups of conductive pads are provided between linear boundaries, where each linear boundary is a straight line defined by a conductive channel positioned between a pair of memory arrays. At least one of the groups of conductive pads includes a first set conductive pads designated as no connect, or floating, for a first chip data width and a second set of conductive pads designated as no connect for a second chip data width.

Thus, when the chip is operating in a first data width, the first set of conductive pads is not connected to external leads. When the chip is operating in a second data width, however, the first set of conductive pads is connected to leads. Some of the conductive pads may be connected to leads in both first and second chip data width applications. The first set of conductive pads are positioned at an end of a row of the conductive pads and adjacent a channel.

Conductive pads are arranged on a die and coupled to associated memory arrays by conductive channels. The pad layout is selected to decrease RC delay on the die and allow for reuse of the layout across different dies fabricated for use at different bus widths or data widths.

In one aspect of the invention, a number of memory array units are formed on a semiconductor die. Each memory array unit includes two or more memory arrays coupled to a channel disposed between the memory arrays. The channel includes one or more data lines coupled to a pad on the die. Each memory array unit utilizes a different channel. The pads on the die are coupled to leads on a metallization layer via bond wires, coupling the memory arrays to an external data bus via those leads. Memory array units are grouped together in pairs on the die to form memory array groups. The straight lines passing through the two channels of each memory array group form boundaries on the die. The pads coupled to each channel of a memory array group are positioned within those boundaries even though some of the pads are not connected to external leads when the die is configured to operate in a first mode, but are connected to external leads when the die is configured to operate in a second mode.

In another aspect of the invention, the pads are arranged such that the same pad layout can be reused across different dies fabricated for use at other bus widths. In this way, the design, fabrication and packaging of semiconductor dies are simplified.

In this way, the lengths of the data lines between the pads and the memory arrays are reduced, thereby reducing the RC delay of the semiconductor die. The invention will be more fully understood upon consideration of the detailed description below, taken together with the accompanying drawings.

BRIEF DESCRIPTION OF THE DRAWINGS

Use of the same reference symbols in different figures indicates similar or identical items.

DETAILED DESCRIPTION

Figure 1:
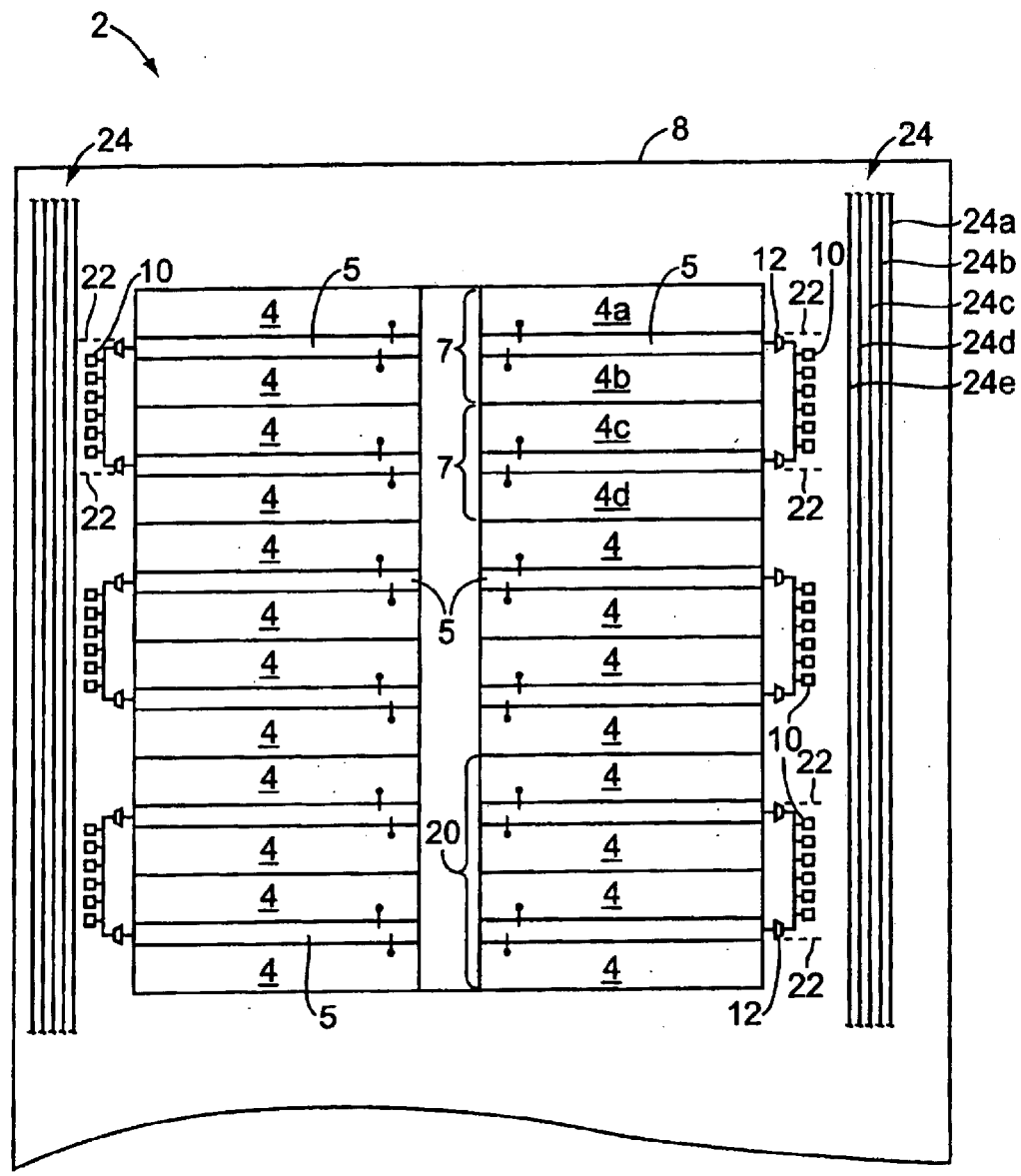
FIG. 1 is a block diagram of a semiconductor die having a number of memory arrays.

Referring to FIG. 1, a block diagram of a semiconductor die 2 is shown. The die 2 includes a number of memory arrays 4. Each memory array 4 is a set of memory cells arranged in rows and columns to form an array. Alternately, other circuits or structures useful for data storage may be used to form each memory array 4. Alternately, the memory arrays 4 may be distributed in a manner other than a row and column arrangement. The semiconductor die 2 may be any device that is used for or that utilizes data storage, such as but not limited to an SRAM, DRAM, FIFO, synchronous dynamic random access memory (SDRAM), extended data output dynamic random access memory (EDO RAM), or burst EDO RAM.

The memory arrays 4 are placed on the die 2 within memory array units 7. Two memory arrays 4 form a single memory array unit 7. For example, one memory array unit 7 is formed by memory arrays 4a, 4b, and a second unit is formed by memory arrays 4c, 4d. The memory arrays 4 within a memory array unit 7 are coupled to a channel 5, which is a set of one or more data lines formed on the die 2. For clarity, the individual data lines in the channel 5 are not shown. The number of individual bus lines within a channel 5 may be dependent on the bus width of the die 2, as described in greater detail below. The number of data lines in the channel 5 is related to the bus width into and out of the memory arrays 4, as described in greater detail below. One bit of data may be transferred over each data line in the channel 5 each clock cycle. Alternately, larger amounts of data may be transferred over the channel 5 each clock cycle. If desired, more than two memory arrays 4 form a single memory array unit 7. If so, each memory array unit 7 may be symmetrical, in which case the same number of memory arrays 4 are utilized on each side of the channel 5, or may be asymmetrical, in which case a different number of memory arrays 4 are utilized on each side of the channel 5.

In one embodiment, each memory array 4 is configured to have 1.5×1024 columns. Thus, each memory array unit 7 has 2×(1.5×1024) columns, or 3072 columns. In the configuration shown in FIG. 1, each memory array 4 in a memory array unit 7 is substantially aligned, such that the columns of each memory array 4 line up with one another. A lesser number of rows than columns is used in each memory array. Thus, each memory array 4 is rectangular, as shown in FIG. 1, instead of square. In this way, the memory arrays 4 extend onto the interior surface of the die 2 to better utilize its available surface area. Each channel 5 is connected to 256 columns of a memory array 4. Alternately, other configurations of each memory array 4 may be used if desired.

The two memory arrays 4 in a memory array unit 7 are separated by the channel 5 to which they are coupled. That is, the channel 5 is positioned between the two memory arrays 4 in a memory array unit 7. Each memory array 4 and corresponding channel 5 within a memory array unit 7 are positioned such that the channel 5 is oriented substantially perpendicular to an edge 8 of the die 2. Alternately, the channel 5 may be angled relative to the edge 8 of the die 2. A boundary 22 is associated and aligned with each channel 5. The boundary 22 is an imaginary line extending along each channel 5, extending beyond channel 5 to edge 8 of die 2. Each channel 5 is substantially straight, and each boundary 22 is a substantially straight extension of its corresponding channel 5. As discussed in more detail below, the pads 10 of each memory array group 20 are positioned within the boundaries 22 of the associated memory array group.

Each channel 5 is coupled to one or more pads 10 on die 2. The pads 10 are conductive areas on the surface of die 2, and are positioned in linear fashion on the periphery of die 2. Alternately, one or more pads 10 are positioned away from the periphery of die 2. Each data line in a channel 5 is coupled to a different pad 10. If desired, a multiplexer 12 may be positioned between channel 5 and its corresponding pads 10, in order to multiplex the individual data lines within a channel 5 onto a single line and reduce the number of lines on the die 2.

A number of power lines 24 are present on die 2. The power lines 24 are conductive traces on the surface of the die 2 that carry electric power to locations on the die 2 adapted to receive power. The power lines 24 may be coupled to power pads (not shown) on die 2, or may be coupled to other structures through which the power lines 24 receive electric power from an external source. In particular, the power line 24a may be connected to $V_{DDQ}/V_{SS}$, the power line 24b may be connected to $V_{SS}/V_{DDQ}$, and the power line 24c may be connected to $V_{DDQ}/V_{SS}$, and the power line 24d may be connected to $V_{DDQ}/V_{SS}$. The power line 24e may be connected to $V_{DDQ}/V_{SS}$. $V_{DDQ}$ may be the input/output supply voltage and $V_{SS}$ may be ground.

In some applications, where the die 2 is operable in different data widths, it is desirable or necessary to connect certain ones memory arrays 4 of one memory array group 20 to leads (not shown) that are physically closer to an adjacent memory array group 20. This is because the pin sequence associated with each data width is different. The two data widths may be, for example, a x18 mode (for 6 channels of 3 bit data) or x36 mode (for 6 channels of 6 bit data). When the die 2 operates in x18 mode, the die 2 uses fewer active input/output pins than when the die 2 operates in x36 mode. Conventionally, as discussed below with reference to FIGS. 6A and 6B, connecting certain ones of the memory arrays 4 of one memory array group 20 to leads (not shown) that are physically closer to an adjacent memory array group 20 has been accomplished by providing an internal data bus (not shown) that extends from one of the memory array groups 20 to the adjacent memory array group 20, across a channel 5. Such an internal data bus tends to increase the RC delay of the die 2 and is, therefore, undesirable.

Figure 2:
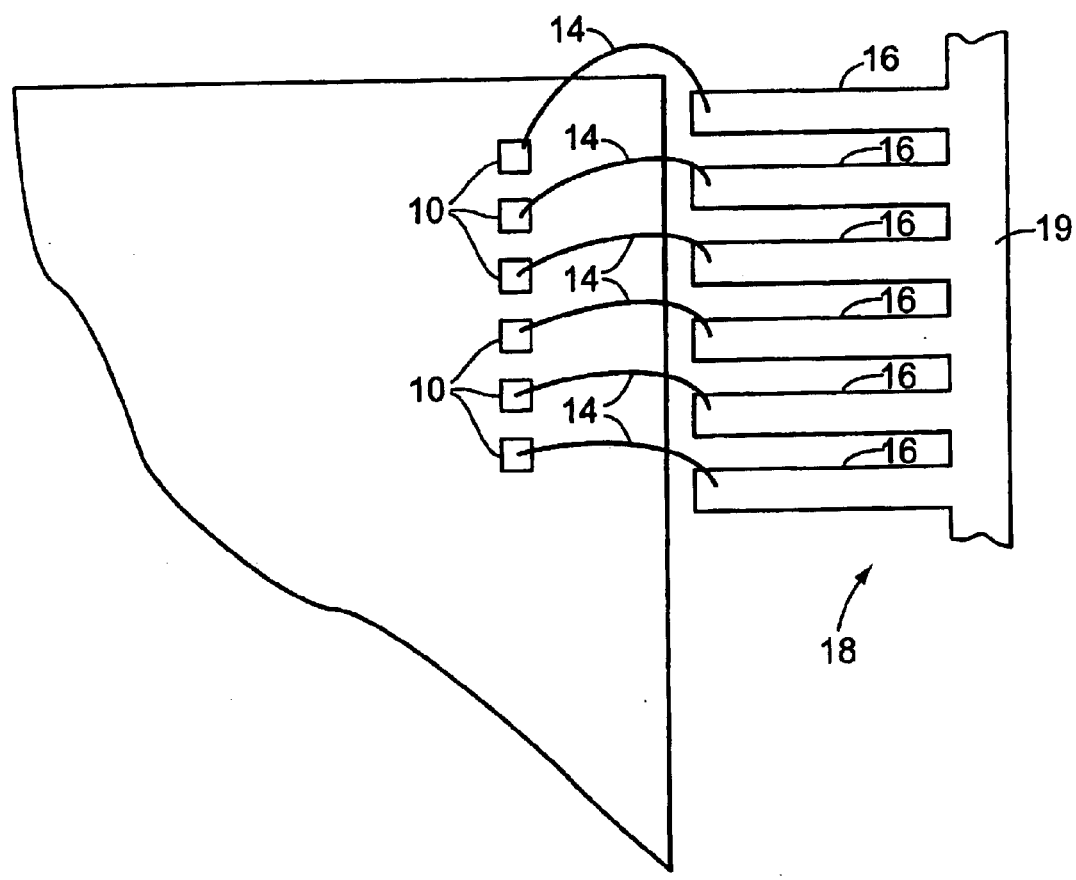
FIG. 2 is a block diagram of a portion of a semiconductor die coupled to a metallization layer via bond wires.

Referring as well to FIG. 2, a bond wire 14 connects each pad 10 to a lead 16 on a metallization layer 18. The metallization layer 18 may be a lead frame or other conductive structure formed as part of a semiconductor package. The leads 16 are connected by a bar 19 during attachment of the die 2 to the metallization layer 18. Afterward, the leads 16 are cut away from the bar 19, such that each lead 16 becomes a pin in the semiconductor package containing the die 2. Alternately, the pins are separate from, and coupled to, the leads 16. The connection of a metallization layer 18 to pads 10 on a die 2 via bond wires 14 is standard to one skilled in the art. Each lead 16 may be coupled to a mating connector (not shown) on a printed circuit board or other device. Such a mating connector, in turn, may be coupled to one or more data buses, such that the bus or buses are coupled to the memory arrays 4 via the lead or leads 16. In this way, the memory arrays 4 may be coupled to one or more data buses outside the die 2.

Referring back to FIG. 1, each memory array unit 7 is grouped with another memory array unit 7 to form a memory array group 20. For example, the memory array unit 7 formed by memory arrays 4a, 4b is grouped with the memory array unit 7 formed by memory arrays 4c, 4d to form a memory array group 20. Each memory array group 20 has two channels 5, and consequently two boundaries 22. The pads 10 coupled to memory arrays 4 within each memory array group 20 are positioned substantially within, or between, two boundaries 22 of that memory array group 20. By positioning pads 10 in this way, the length of channels 5 between memory arrays 4 and pads 10 is relatively short, such that only a small RC delay is attributable to each channel 5. Other types of pads, such as ground pads or power pads, may be interspersed between data pads 10 coupled to memory arrays 4, so long as data pads 10 of each memory array group 20 are positioned substantially within boundaries 22 of that memory array group 20.

In accordance with an embodiment of the present invention, the data pads 10 of a memory array group 20 are positioned such that the data pads 10 lie within the boundaries 22 of that memory array group 20. A subset of these pads 10 is connected to external leads when the die 2 operates in one mode and are not connected to external leads when the die 2 operates in another mode. Thus, rather than having an elongated internal bus that extends from one memory array group 20 to another memory array group 20 to provide connection between a memory array unit 4 of one group 20 to a pad 10 of an adjacent group 20, additional pads 10 are provided. The additional pads 10 are connected to external leads 16 (FIG. 2) when the die 2 is configured to operate in one mode and are not connected to external leads 16 when the die 2 is configured to operated in another mode.

In this way, the length of each data bus, which is the combined length of each channel 5 and the associated conductive trace or other structure coupling that channel to a pad 10, is only slightly longer than the channel 5. This is an improvement over known dies, in which the internal data bus extends from one memory array group 20 to another, adjacent memory array group 20. Thus, RC delay between a memory array 4 and the corresponding pad 10 on a die 2 is reduced in comparison to known dies. The placement of a number of pads 10 between boundaries 22 of each memory array group 20 results in a pad layout on die 2. That is, the pad layout is the configuration formed by the pads 10 on the die 2.

The bus width, or chip data width, is the number of bits that can be input to or accessed from the die 2 during a single clock cycle. Dies 2 that utilize memory arrays 4 may be designated as xB devices, where B is the bus width of the die 2. For example, a x9 device has a 9 bit bus width, a x18 device has an 18 bit bus width, and a x36 device has a 36 bit bus width.

FIG. 1 shows an embodiment of a x36 device, in which 36 bits of data can be read or written each clock cycle. Six channels 5 are used, so six bits can traverse each channel 5 each clock cycle. Each channel 5 has six data lines. One bit of data can be read or written each clock cycle over each of six data lines in a channel 5. The number of memory arrays 4 on die 2 is proportional to the bus width. That is, each data line may be connected to a single memory array 4, such that the use of six data lines per channel 5 at a bus width of 36 bits corresponds to the use of 36 different memory arrays 4 on die 2.

For a x18 device, half as many data lines are used as are used for a x36 device. Six channels 5 are used, so three bits can traverse each channel 5 each clock cycle. Each channel 5 has three data lines. The number of memory arrays 4 on die 2 is proportional to the bus width. That is, each data line may be connected to a single memory array 4, such that the use of three data lines per channel 5 at a bus width of 18 bits corresponds to the use of 18 different memory arrays 4 on die 2. Thus, half as many data I/O pads 10 are needed for a x18 device. Consequently, pads 10 can be laid out on a x18 device in the same manner as for a x36 device, with the same number of pads 10 in the same layout, but only a subset of those pads 10 are coupled to memory arrays 4. The other pads 10 are unused. That is, the pad layout 30 can form a fixed configuration, meaning that the pad layout 30 on the die 2 is fixed across different dies 2 having different bus widths. Thus, the same pad layout 30 can be used on two or more different dies 2, each adapted to function at a different bus width, or in different modes. In this way, design and construction of die 2 is simplified.

Figure 3:
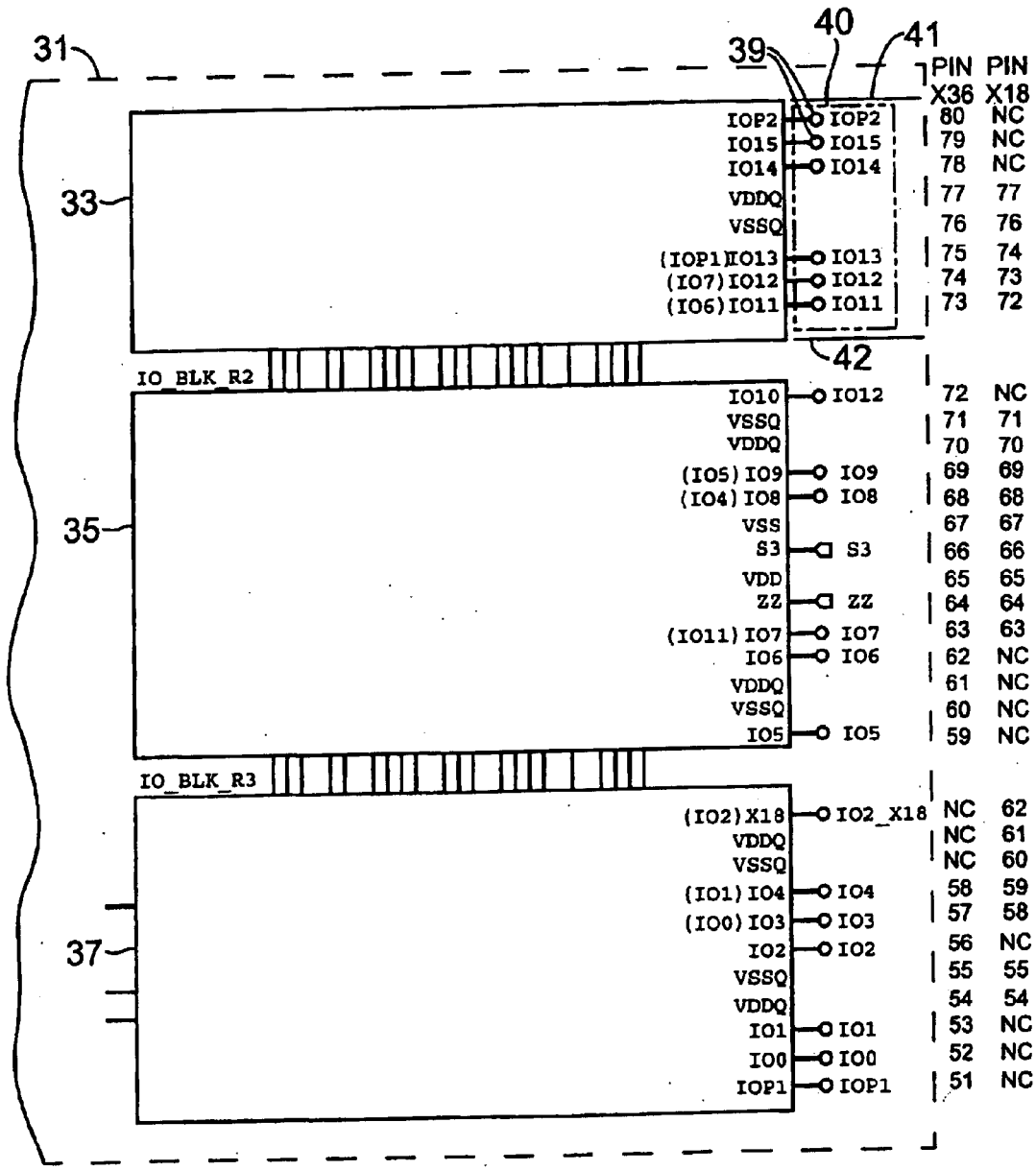
FIG. 3 is a block diagram of a pad layout on a die.

Referring next to FIG. 3, an example of the layout on a die 31 is shown. As shown in the portion of the die 31 illustrated, three memory array groups 33, 35, and 37 are positioned along an edge of the die 31. The memory array group 33 includes pads 39 arranged in linear fashion in an area 40. The area 40 is confined between straight boundary lines 41, 42 extending from edges of the memory array group 33. A first column of numbers labeled "Pin x36" is positioned adjacent the pads 39 lists, for each pad 39, the number of an external pin electrically connected to the adjacent pad 39. Similarly, a second column of numbers labeled "Pin x18" lists, for each pad 39, the number of an external pin electrically connected to the adjacent pad 39. The NC designation stands for "no connection" and indicates that the adjacent pad is not connected to an external pin when the die 31 is configured in the mode identified by the column heading. A "no connection" pad may also be referred to as a "floating pad."

Thus, where the die 31 is a x18 device, or another device having a bus width less than that of a x36 device, the pad layout on die 31 is the same. Where the die 31 has a bus width less than that of a x36 device, however, less than all of the pads 39 are coupled to memory arrays groups 33, 35, and 37. The pads 39 that are not used are not coupled to any of the channels (see, e.g., FIG. 1) are referred to as floating pads. The floating pads facilitate the use of a fixed configuration of pads 39 across different dies 31 having different bus widths. That is, the same pad layout can be utilized on different dies 31 having different bus widths ranging from a minimum to a maximum, where at least one pad 39 is floating when the die 31 utilizing that pad layout has a bus width, or data width, less than the maximum.

Similarly, dies 31 having other bus widths may utilize the pad layout of FIG. 3. For example, a x6 or x9 device may utilize the pad layout of FIG. 3, where fewer pads 39 are used and more pads 39 are floating. Further, the present invention may also be employed with chips having a bus width larger than 36 bits.

Figure 4:
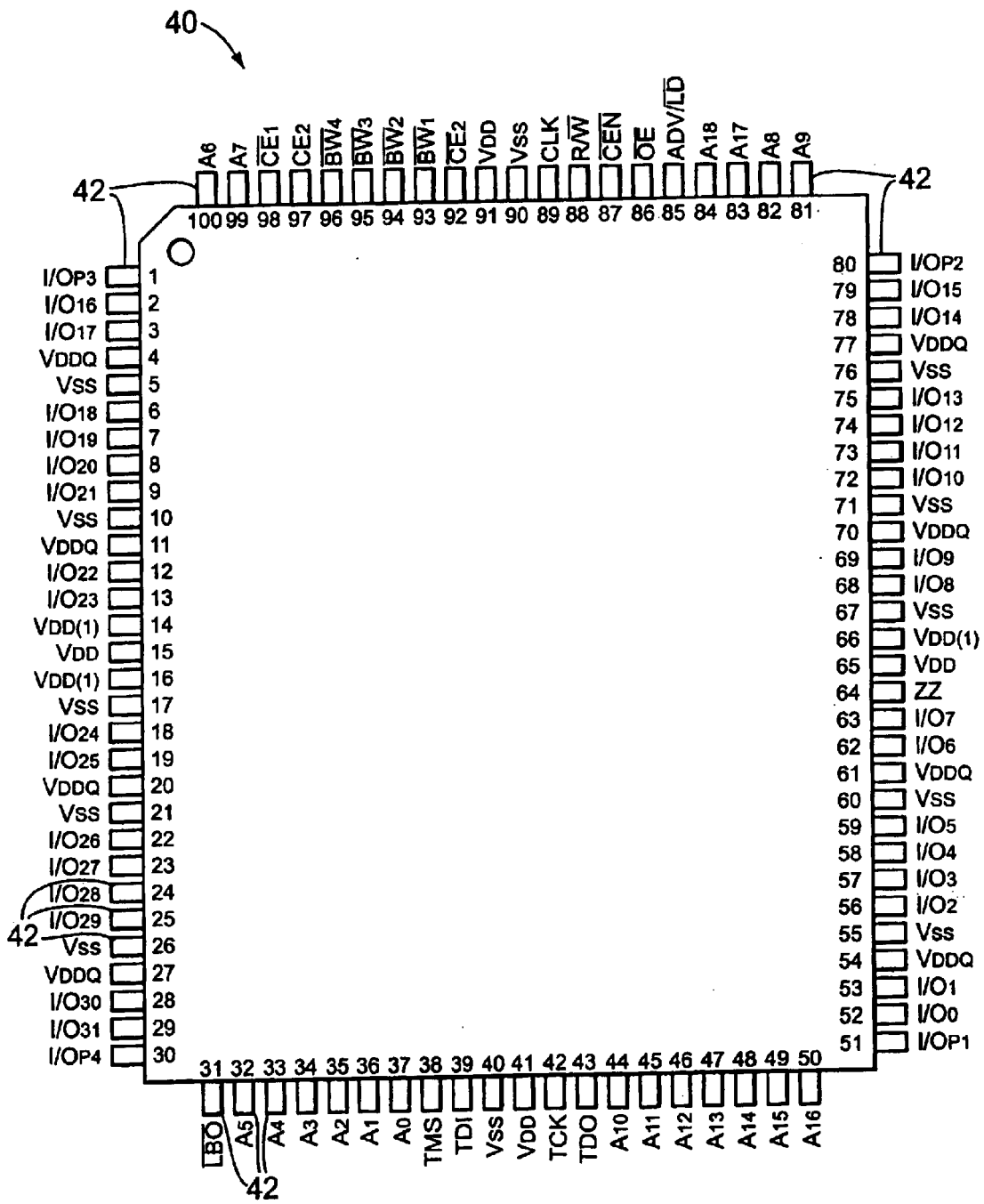
FIG. 4 is a block diagram of a first semiconductor package containing a die having a 32-bit bus width.

Referring to FIG. 4, the outline of and pin location on an exemplary first semiconductor package 40 is shown. The first semiconductor package 40 contains a die (not shown) having a bus width of 36 bits, such that the die is a x36 device. The first semiconductor package 40 includes a number of pins 42 extending therefrom. Each pin 42 is connected to a lead 16 of the metallization layer 18. Referring also to FIG. 2, each pin 42 through which data passes is coupled to a pad 10 via a bond wire 14 coupling the pad 10 to the corresponding lead 16.

Figure 5:
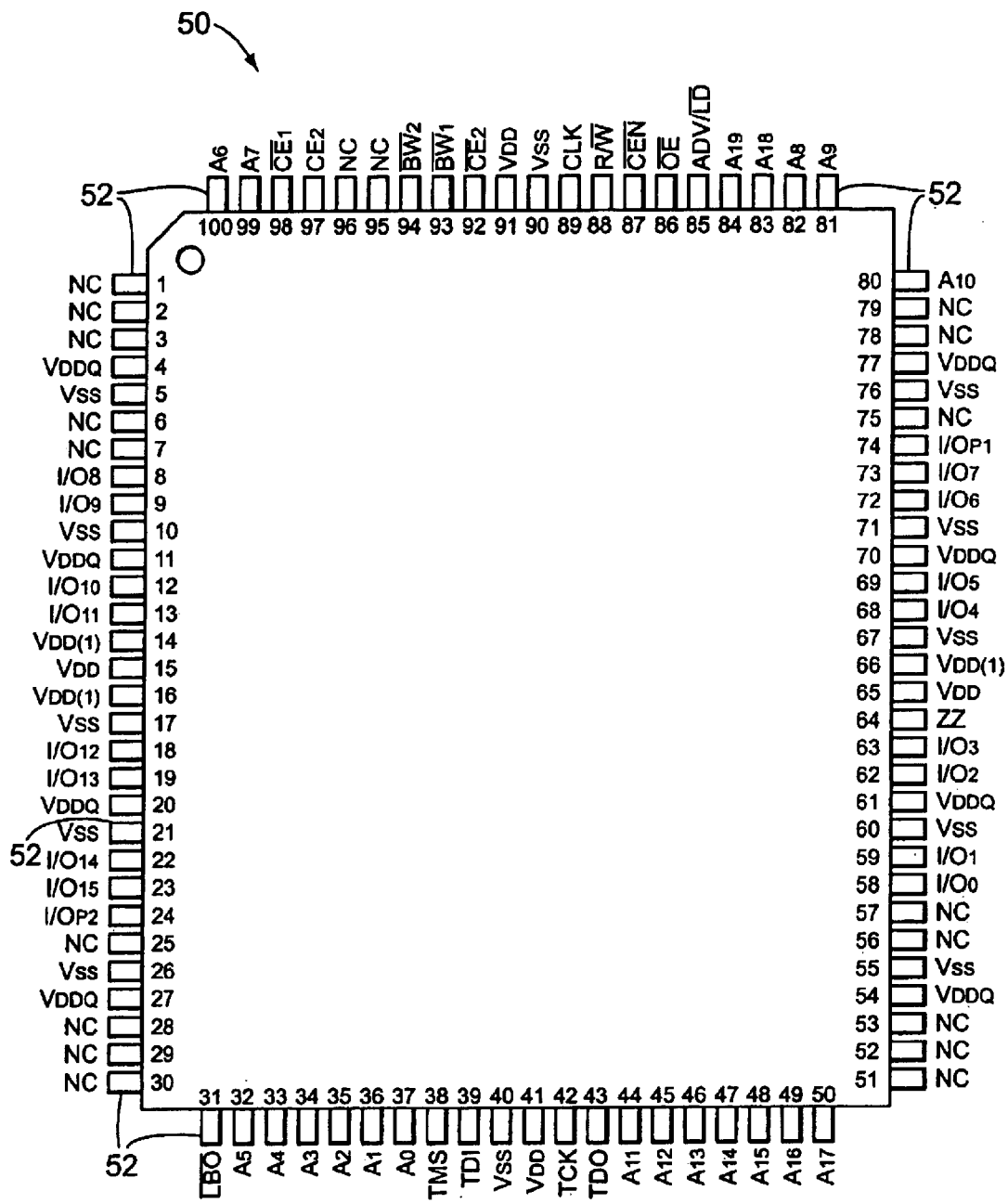
FIG. 5 is a block diagram of a second semiconductor package containing a die having a 16-bit bus width.

Referring to FIG. 5, the outline of and pin location on an exemplary second semiconductor package 50 is shown. The second semiconductor package 50 contains a die (not shown) having a bus width of 18 bits, such that the die is a x18 device. The second semiconductor package 50 includes a number of pins 52 extending therefrom. Referring also to FIG. 2, each pin 52 is connected to a lead 16 of the metallization layer 18. Each pin 52 through which data passes is coupled to a pad 10 via a bond wire 14 coupling the pad 10 to the corresponding lead 16.

The packages 40, 50 are shown with a number of exemplary pins. These pins are defined in Table 1 below. As shown therein, the functions assigned to each pin are standard and well-known to those skilled in the art. With regard to the $V_{DD(1)}$ pins, these pins need not be connected directly to $V_{DD}$ as long as the input voltage on these pins is above a minimum input high voltage. In certain low-power, high speed memories, the input high voltage is between 1.7V–2.925 V. Alternately, another range for the input high voltage may be utilized.

TABLE 1

Pin Definitions for Packages 40, 50

| Pin | Functions | Direction | Type |
|---|---|---|---|
| $A_0$–$A_{19}$ | Address Inputs | Input | Synchronous |
| $\overline{CE}_1$, $CE_2$, $\overline{CE}_2$ | Chip Enables | Input | Synchronous |
| $\overline{OE}$ | Output Enable | Input | Asynchronous |
| $R/\overline{W}$ | Read/Write Signal | Input | Synchronous |
| $\overline{CEN}$ | Clock Enable | Input | Synchronous |
| $\overline{BW}_1$, $\overline{BW}_2$, $\overline{BW}_3$, $\overline{BW}_4$ | Individual Byte Write Selects | Input | Synchronous |
| CLK | Clock | Input | N/A |
| ADV/$\overline{LD}$ | Advance Burst Address/Load New Address | Input | Synchronous |
| $\overline{LBO}$ | Linear/Interleaved Burst Order | Input | Static |
| TMS | Test Mode Select | Input | N/A |
| TDI | Test Data Input | Input | N/A |
| TCK | Test Clock | Input | N/A |
| TDO | Test Data Input | Output | N/A |
| ZZ | Sleep Mode | Input | Synchronous |
| $I/O_0$–$I/O_{31}$, $I/O_{P1}$–$I/O_{P4}$ | Data Input/Output | I/O | Synchronous |
| $V_{DD}/V_{DD(1)}$, $V_{DDQ}$ | Core Power, I/O Power | Supply | Static |
| $V_{SS}$ | Ground | Supply | Static |

As is shown in FIGS. 1, 4 and 5, the sequence and location of the pins 42, 52 carrying power to die 2 is maintained across packages 40, 50 containing different dies 2. In this way, design of a mating receptacle (not shown) for the package 50 is simplified, because the same receptacle can then be used to receive different packages 40, 50. The locations of the pins 42, 52 carrying power on a package 40, 50 are related to the pad layout 30 on the die 2 within the package 40, 50. That is, the order of the pads 10 on the die 2 corresponds to the order of the pins 42, 52 carrying data on a package 40, 50, and the order of the power lines 24 on the die 2 corresponds to the order of the pins 42, 52 carrying power on a package 40, 50. In this way, the power and data connections between the die 2 and the pins 42 are kept short, and the likelihood of crossed connections or other defects is reduced. The sequence and location of the pins 42, 52 carrying data to the die 2 are different across the packages 40, 50.

For example, referring to FIGS. 1 and 4, the pins 42 numbered 76, 77 are each connected to one of the two power lines 24 at the top right of FIG. 1. These two power lines 24 pass between pads 10 on the die 2. At the middle right of FIG. 1, three groups of power lines 24 pass between pads 10 on the die 2. The pins numbered 70, 71 are each connected to one of the two power lines 24 of the upper group. The pins numbered 64–67 are each connected to one of the four power lines of the middle group. The pins numbered 60–61 are each connected to one of the two power lines in the lower group. The pins numbered 54, 55 are each connected to one of the two power lines 24 at the bottom right of FIG. 1. As is seen in FIGS. 1 and 4, the location of the pads 10 and power lines 24 on die 2 is carried through to the location of the power and data pins 42 on the package 40.

As shown in FIGS. 4–5, the layout of the pins 42, 52 on the right side of the package 40, 50 is inverted from that of the left side. That is, the pins 42, 52 are laid out such that the package 40, 50 can be rotated 180° from a starting position with the result that the pin layout on a particular side of the package 40, 50 is the same. Consequently, the layout on die 2 of the pads 10 and the power lines 24 corresponding to the pins 42, 52 is also inverted from the right side to the left side.

Figure 6A:
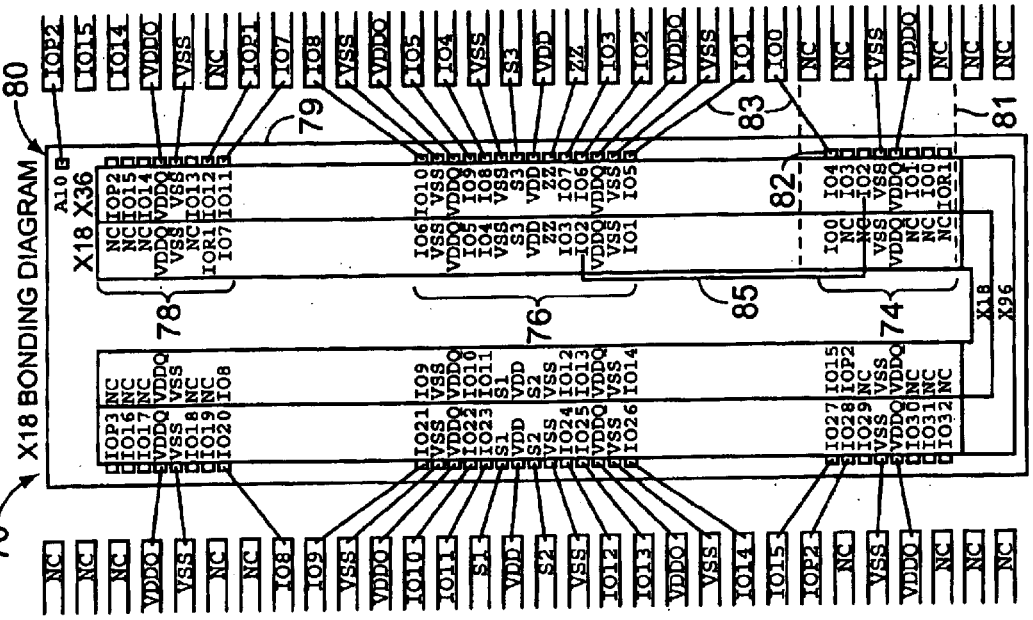
FIGS. 6A and 6B schematically illustrate a prior art memory device layout.
Figure 6B:
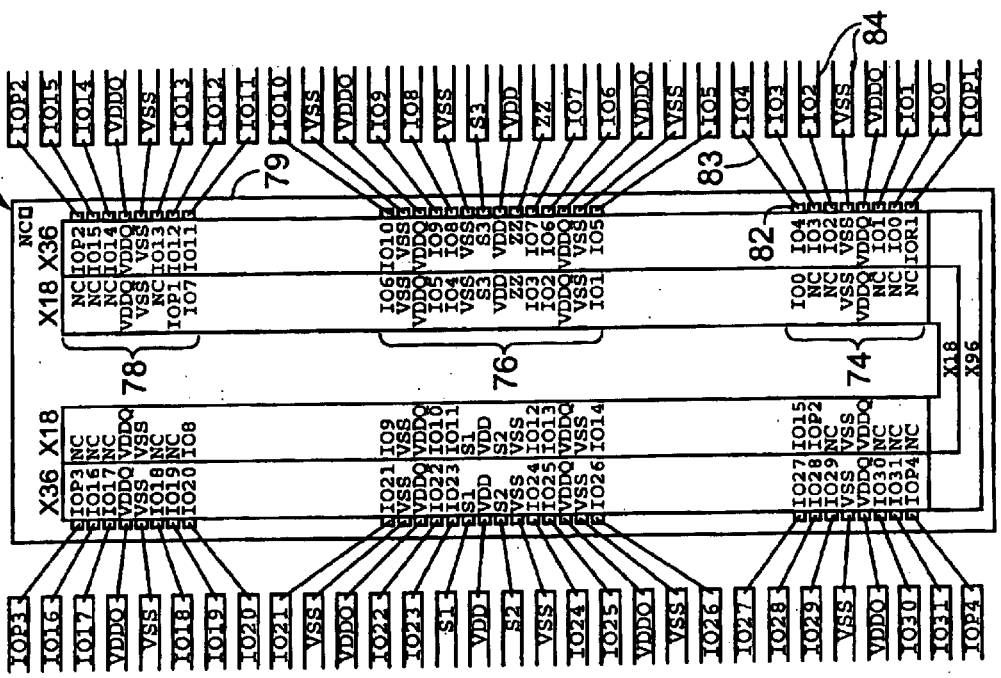

FIGS. 6A and 6B illustrate details of a conventional layout 70 on a die 80. FIG. 6A illustrates the layout 70 in a x36 configuration and FIG. 6B illustrates the layout 70 in a x18 configuration. The die 80 includes memory array group 74, 76, and 78 arranged along an edge 79 of the die 80. A set of pads 82 are within the boundaries of the memory array group 74 and are each bonded to one of pins 84. The pins 84 of FIG. 6A are arranged in a certain, predetermined, pin sequence that corresponds with the sequence of the associated pads 82 of the memory array group 84.

For purposes of illustration, two columns of pin identifiers are positioned adjacent the pads 82 to identify the pin 84 to which each pad 82 is connected in a x18 configuration and in a x36 configuration. The column of pin identifiers that identify the pin 84 to which each pad 82 is connected in a x18 configuration is labeled "x18" and the column of pin identifiers that identify the pin 84 to which each pad 82 is connected in a x36 configuration is labeled "x36". In FIG. 6A, each of the bonding pads 82 of the memory array group 74 is connected by a bond wire 83 to an associated one of the pins 84 in the x36 configuration. Similarly, each of the bonding pads of the memory array groups 76, 78 are connected a bond wire 83 to an associated one of the pins 84 in the x36 configuration. Thus, in the x36 configuration shown in FIG. 6A, each of the pads 82 are connected to an associated pin 84, with none of the pads 82 floating.

In this x36 configuration, 18 bits of data may be read from memory array groups 74, 76, 78, with 6 bits of data being read from each memory array group. For example, from memory array group 74, a bit of data corresponding to each of IOP1, IO0, IO1, IO2, IO3, IO4 is read simultaneously. Likewise, from memory array group 76, a bit of data corresponding to each of IO5, IO6, IO7, IO8, IO9, IO10 is read simultaneously. Similarly, from memory array group 78, a bit of data corresponding to IO11, IO12, IO13, IO14, IO15, IOP2.

FIG. 6B shows the die 82 in a x18 configuration, where 9 bits of data are simultaneously read from each side of the die 82. In this x18 configuration, 3 bits of data are simultaneously read from each of the memory array groups 74, 76, and 78. Due to the pin sequence shown in FIG. 6B, an internal data bus 85 is conventionally disposed and extends between memory array groups 74 and 76 to permit connection of the memory array group 74 to the lead, or pin, IO2 for the x18 bonding arrangement shown. A similar internal data bus (not shown) is also required between the memory array groups 74, 76 to permit connection of the memory array group 74 to the pin IO1.

The internal data bus 85 is relatively long and extends between memory array groups 74, 76 to connect a memory array of the memory array group 74 with a pad positioned within the boundaries 81 of the memory array group 76. Due to the length of the internal data bus 85, the internal data bus 85 imparts significant RC delay. The internal data bus 85 is not used in the x36 configuration of FIG. 6A, since the lead IO2 is located near and may be easily connected to the associated pad 82 using bond wire 83.

Figure 7B:
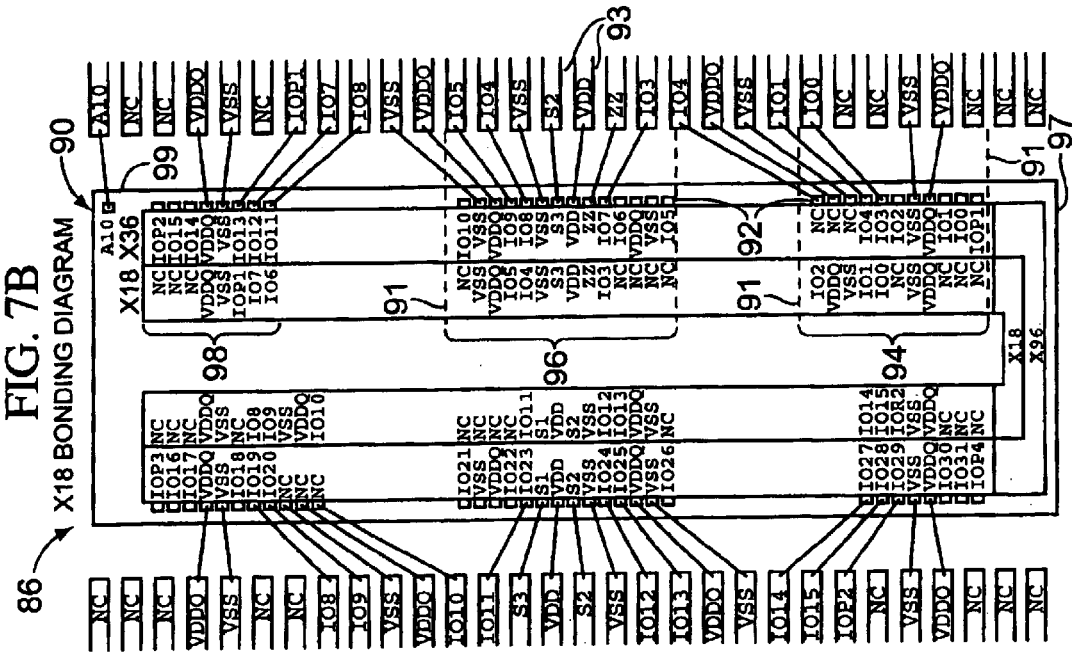
FIGS. 7A and 7B schematically illustrate a memory device layout in accordance with an embodiment of the present invention.
Figure 7A:
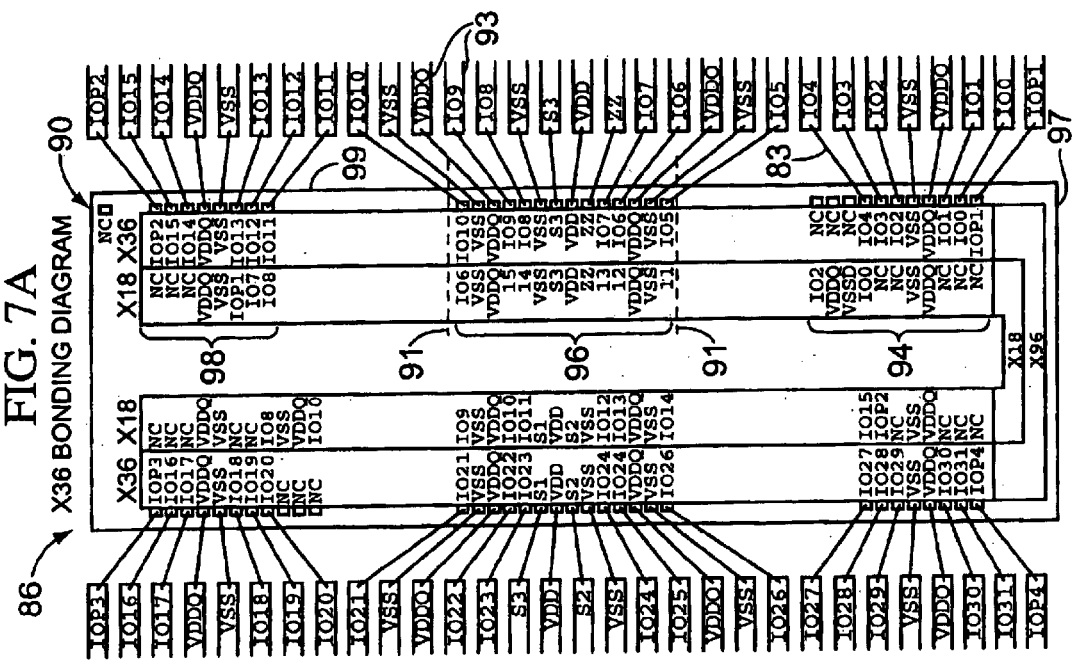

FIGS. 7A and 7B illustrate details of a layout 86 on a die 90 in accordance with an embodiment of the present invention. FIG. 7A illustrates the layout 86 in a x36 configuration and FIG. 7B illustrates the layout 86 on the die 90 in a x18 configuration.

The die 90 includes memory array groups 94, 96, 98 arranged along an edge 99 of the die 90. A set of pads 92 is within the boundaries 91 of each of the memory array groups 94, 96, 98, each of which is bonded to one of pins 84. The pins 93 of FIG. 7A are arranged in a certain, predetermined, pin sequence that corresponds with the sequence of the associated pads 92 of the memory array groups 94, 96, 98.

For purposes of illustration, two columns of pin identifiers are positioned adjacent the pads 92 to identify the pin 93 to which each pad 92 is connected in a x18 configuration and in a x36 configuration. The column of pin identifiers that identify the pin 93 to which each pad 92 is connected in a x18 configuration is labeled "x18" and the column of pin identifiers that identify the pin 93 to which each pad 92 is connected in a x36 configuration is labeled "x36". In FIG. 7A, fewer than all of the pads 92 of the memory array group 94 are connected by a bond wire 83 to an associated one of the pins 93 in the x36 configuration. Indeed, as shown, the pads 92 of the memory array group 94 are arranged in a linear fashion with the three pads farthest from edge 97 and closest to memory array group 96 designated as no connect pads; these pads are floating pads in the x36 configuration of FIG. 7A. Each of the pads 92 of the memory array groups 96, 98 are connected by a bond wire 83 to an associated one of the pins 84 in the x36 configuration. Thus, in the x36 configuration shown in FIG. 7A, each of the pads 92 associated with the memory array groups 96, 98 are connected to an associated pin 93.

In this x36 configuration, 18 bits of data may be read from memory array groups 94, 96, 98, each clock cycle, with 6 bits of data being read from each memory array group. For example, from memory array group 94, a bit of data corresponding to each of IOP1, IO0, IO1, IO2, IO3, IO4 is read simultaneously. Likewise, from memory array group 76, a bit of data corresponding to each of IO5, IO6, IO7, IO8, IO9, IO10 is read simultaneously. Similarly, from memory array group 78, a bit of data corresponding to IO11, IO12, IO13, IO14, IO15, IOP2. In the x36 configuration, the floating pads are not connected to any external pins. As shown, an additional 18 bits of data may be read each clock cycle from the other memory array groups of FIG. 7A.

In FIG. 7B, the three floating pads 92 associated with the memory array group 94 are used for connection to external pins in the x18 configuration. As shown, these three floating pads are used to connect the memory array group 94 to the pins 102, $V_{DDQ}$, and $V_{SS}$, thus eliminating the need for an elongated internal bus, such as the bus 85 of FIG. 6B, extending between the memory array groups 94, 96. Three bits of data may be simultaneously read from the memory array group 94 over pins IO0, IO1, and IO2 without traversing an internal bus extending from the memory array group 94 to the memory array group 96. By eliminating the need for such an elongated internal bus, the RC delay of the die 90 is reduced, thereby improving performance.

The pads that comprise floating, or no connect pads, in the x36 configuration are used in the x18 configuration to permit the memory array group 94 to connect to the pins 93 in the designated pin sequence.

In the prior art implementation shown in FIGS. 6A and 6B, it is impossible to bond out in the sequence of the external pins without substantially increasing the length of the traversal of the internal data bus. In the present invention, however, by adding the additional floating pads 92 (FIG. 7A), the die 90 may be bonded to the associated leads in accordance with the external lead sequence in different chip data widths, without requiring a substantially elongated internal data bus that extends between the memory array groups 94, 96.

Although the invention has been described with reference to particular embodiments, the description is only an example of the invention's application and should not be taken as a limitation. Consequently, various adaptations and combinations of features of the embodiments disclosed are within the scope of the invention as defined by the following claims and their equivalents.

What is claimed is:

1. A semiconductor die for connection to a metallization layer, comprising:

a plurality of memory array groups, each memory array group having at least two memory array units, each said memory array unit comprising at least two memory arrays;

two channels associated with each said memory array group, wherein each said channel is coupled to a different memory array unit and positioned between at least two said memory arrays of said memory array unit, and wherein each said channel defines a boundary line parallel to an outer edge of each said channel and extending to an edge of the die; and a plurality of conductive pads coupled to each said channel, wherein said conductive pads associated with each said memory array group are positioned such that greater than half of each conductive pad's surface area is located within a region of said semiconductor die that is external to an edge of said memory array and further circumscribed by said boundary lines, a first subset of the conductive pads being connected by bond wires to external leads in a first memory array configuration and not connected to any of the external leads in a second memory array configuration.

2. The semiconductor die of claim 1, wherein all of said conductive pads are positioned within said boundaries.

3. The semiconductor die of claim 1, wherein the first memory array configuration is a x36 configuration and the second memory array configuration is a x18 configuration.

4. The semiconductor die of claim 1, a second subset of the conductive pads being connected by bond wires to external leads in the second memory array configuration and not connected to any of the external leads in the first memory array configuration.

5. The semiconductor die of claim 1, wherein said channel comprises a plurality of data lines.

6. The semiconductor die of claim 1, wherein each said memory array unit is symmetrical.

7. The semiconductor die of claim 1, further comprising a multiplexer coupled to each said channel between said memory arrays and said pads.

8. The semiconductor die of claim 1, further comprising at least one additional memory array group.

9. The semiconductor die of claim 1, wherein each said memory array unit comprises a plurality of memory cells arranged in a number of rows and columns, wherein said number of columns is greater than said number of rows.

* * * * *

UNITED STATES PATENT AND TRADEMARK OFFICE
CERTIFICATE OF CORRECTION

PATENT NO. : 6,975,527 B1
DATED : December 13, 2005
INVENTOR(S) : Kee Park

It is certified that error appears in the above-identified patent and that said Letters Patent is hereby corrected as shown below:

Title page,
Item [57], ABSTRACT,
Line 15, delete "to.".

Signed and Sealed this

Fourteenth Day of February, 2006

JON W. DUDAS
*Director of the United States Patent and Trademark Office*